United States Patent [19]

Barth

[11] Patent Number: 5,763,326
[45] Date of Patent: Jun. 9, 1998

[54] ETCHING PROCESS AND DEVICE FOR CLEANING SEMICONDUCTOR COMPONENTS, IN PARTICULAR POWER DIODES

[75] Inventor: Stephan-Manuel Barth, Gröbenzell, Germany

[73] Assignee: Robert Bosch GmbH, Stuttgart, Germany

[21] Appl. No.: 525,592

[22] PCT Filed: Mar. 12, 1994

[86] PCT No.: PCT/DE94/00246

§ 371 Date: Sep. 20, 1995

§ 102(e) Date: Sep. 20, 1995

[87] PCT Pub. No.: WO94/22165

PCT Pub. Date: Sep. 29, 1994

[30] Foreign Application Priority Data

Mar. 20, 1993 [DE] Germany ............... 43 08 990.9

[51] Int. Cl.$^6$ .................................................. C23F 1/02
[52] U.S. Cl. ................... 438/714; 438/715; 438/906; 438/935; 134/1.2; 156/345
[58] Field of Search ..................... 156/643.1, 653.1, 156/345; 134/1.1, 1.2, 1.3; 204/298.15, 298.33; 427/9; 438/714, 715, 906, 935

[56] References Cited

U.S. PATENT DOCUMENTS

| 4,341,594 | 7/1982 | Carlson et al. | 156/643.1 |
| 4,512,868 | 4/1985 | Fujimura et al. | 156/345 |
| 4,863,561 | 9/1989 | Freeman et al. | 156/646.1 |
| 4,923,828 | 5/1990 | Gluck et al. | 156/646.1 |
| 4,946,549 | 8/1990 | Bachman et al. | 156/345 |
| 4,983,254 | 1/1991 | Fujimura et al. | 156/345 |
| 5,000,819 | 3/1991 | Pedder et al. | 216/69 |
| 5,175,124 | 12/1992 | Winebarger | 134/1.3 |
| 5,225,036 | 7/1993 | Watanabe et al. | 156/646.1 |
| 5,252,181 | 10/1993 | Dutartre et al. | 134/1.1 |
| 5,580,384 | 12/1996 | Thiebaud et al. | 118/728 |

FOREIGN PATENT DOCUMENTS 57-111055   7/1982   Japan .

OTHER PUBLICATIONS

Patent Abstracts of Japan, vol. 6, No. 200 (E–135) 9 Oct. 1982 & JPA 57 111 055 (Shin Nippon Denki KK) 10 Jul. 1982.
IBM Technical Disclosure Bulletin, vol. 32, No. 6A, p. 362, Nov. 1989, New York, U.S.

*Primary Examiner*—R. Bruce Breneman
*Assistant Examiner*—Anita Alanko
*Attorney, Agent, or Firm*—Kenyon & Kenyon

[57] ABSTRACT

A plasma etching process for cleaning laterally exposed p-n junctions of semiconductor elements, in particular power diodes after soldering together the semiconductor chip in question and connection elements is proposed, wherein the etching gases employed are fluorine compounds. Since the process according to the present invention does not involve doping dependence and crystal orientation dependence, it produces essentially vertically oriented chip-edges after etching and as a result a lower failure rate compared to the known wet-etching process. Since numerous rinsing processes can also be dispensed with, the plasma etching process is more suitable for mass production.

19 Claims, 1 Drawing Sheet

ETCHING PROCESS AND DEVICE FOR CLEANING SEMICONDUCTOR COMPONENTS, IN PARTICULAR POWER DIODES

FIELD OF THE INVENTION

The present invention relates to an etching process for cleaning laterally exposed p-n junctions of semiconductor elements, especially power diodes, after the semiconductor chip in question has been provided with connection elements, for example by soldering them together, and to an apparatus for carrying out the process.

BACKGROUND INFORMATION

The fabrication of, for example, power diodes conventionally involves, after the cold base, the diode chip and the top wire have been soldered together, a cleaning operation, by silicon removal, of the p-n junctions of the diode chip, which up to this point are still laterally exposed, by means of a wet-chemical alkaline etching process, e.g., by means of aqueous KOH, in order to develop the blocking ability of the p-n junctions. This known process has the drawback that the lateral silicon removal takes place as a function of doping and crystal orientation, so that the etching contours produced differ greatly in the various doping regions in how pronounced they are. Moreover, capillary effects may arise as a function of the shape of the connection elements. Furthermore, the etching solution is prone to external contamination, and there is a concentration, temperature and agitation dependence and a dependence on electrochemical potential differences specific to the etching system. In addition, this wet-chemical etching process is very complicated, owing to the numerous rinsing processes required. These drawbacks as a whole, particularly in mass production, again and again lead to considerable losses in yield, whose causes are very difficult to find, owing to the large number of mechanisms involved.

While plasma etching processes are known in semiconductor technology, they are employed almost exclusively in the production of wafers.

It is an object of the present invention to provide an etching process of the type mentioned at the outset and an apparatus for carrying it out, by means of which process improved etching contours can be achieved independent of the doping profile of the laterally exposed semiconductor chips.

SUMMARY OF THE INVENTION

The plasma etching process according to the present invention, for the purpose of cleaning the laterally exposed p-n junctions of semiconductor elements, has the advantage, compared with the wet-chemical alkaline etching process, that the achievable etching contours on the individual component are far superior to those in the case of wet etching, the chip edge formed, in particular, running almost vertically in the case of plasma etching.

This advantage of the plasma etching process according to the present invention makes it possible even to treat diodes having very shallow (i.e., situated close to the connection elements) p-n junctions which are very inadequately dealt with in the course of wet etching. Typical depths in the process are 10–20 μm. The main reason for these advantages is that the plasma etching process is largely independent of orientation and doping. Because the numerous rinsing processes are dispensed with, the plasma etching process is particularly suitable for mass production, and the yield can even be improved, compared with the wet—chemical etching process, if process parameters are suitably chosen.

The etching gases employed include, for example, nitrogen fluorides, sulfur fluorides or carbon fluorides, especially $CF_4$, $SF_6$ or $NF_3$.

An advantageous implementation of the etching process according to the present invention includes in the etching gas, which has been ionized by the injection of high-frequency electro-magnetic waves, especially microwaves, being supplied in a plasma reaction vessel to the semiconductor elements to be cleaned. In this arrangement, the etching gas flows through the plasma reaction vessel at a pressure of preferably 0.1–10 mbar.

So as to carry out the thermally activated etching operation as quickly and optimally as possible, the semiconductor elements are expediently heated to a temperature below the melting point of the solder near the melting point. To enable as close and accurate a setting of said temperature as possible, a temperature control mechanism is found to be particularly beneficial. For the purpose of heating, the semiconductor elements of the form indicated are placed with their cold bases onto a heating device, in particular a hotplate.

Even better results during the etching operation according to the present invention are achieved by the etching gas being admixed with an oxygen-containing gas, e.g., $O_2$ or $N_2O$. The admixed gas makes it possible to effect, in certain cases, a maximization of the etching rate with simultaneous minimization of an etching gas-specific layer deposition.

In the case of very highly blocking diodes, etching gas-specific contaminants of the plasma etching process according to the present invention may cause the blocking-state voltage-current characteristics of the diodes to be of insufficient quality and e.g., to show instabilities. In order to achieve optimum results in this case, it is expedient to carry out a wet-chemical or plasma-chemical aftertreatment. The wet-chemical after-treatment is preferably performed by means of a dilute alkali (eg KOH) or deionized water. If a plasma-chemical aftertreatment is preferred, this is carried out by means of an $O_2$- or $H_2$- or $N_2$- containing plasma. Equally, tempering of the etched parts in an inert gas atmosphere (e.g., $N_2$ gas) is beneficial to the blocking ability. This aftertreatment is applied for so short a time only, compared with the etching process according to the present invention, that the etching profile-determining process of plasma etching by means of fluorine compounds is retained.

According to an advantageous arrangement for carrying out the etching process according to the present invention, a plasma reaction vessel connected to a pump and a system for generating a plasma from a gaseous fluorine compound as the etching gases are provided, a heating device which accommodates the semiconductor elements to be treated and is provided with through holes being arranged in the plasma reaction vessel. The system for generating the plasma is expediently disposed upstream of the plasma reaction vessel and has a feed line for the gaseous fluorine compound.

The heating device for heating the semiconductor elements expediently comprises at least one hotplate. Connected thereto there is a temperature controller.

BRIEF DESCRIPTION OF THE DRAWINGS

An illustrative embodiment of an apparatus for carrying out the etching process according to the present invention is shown in the drawing and explained in more detail in the following description.

DETAILED DESCRIPTION OF THE INVENTION

Figure 1:
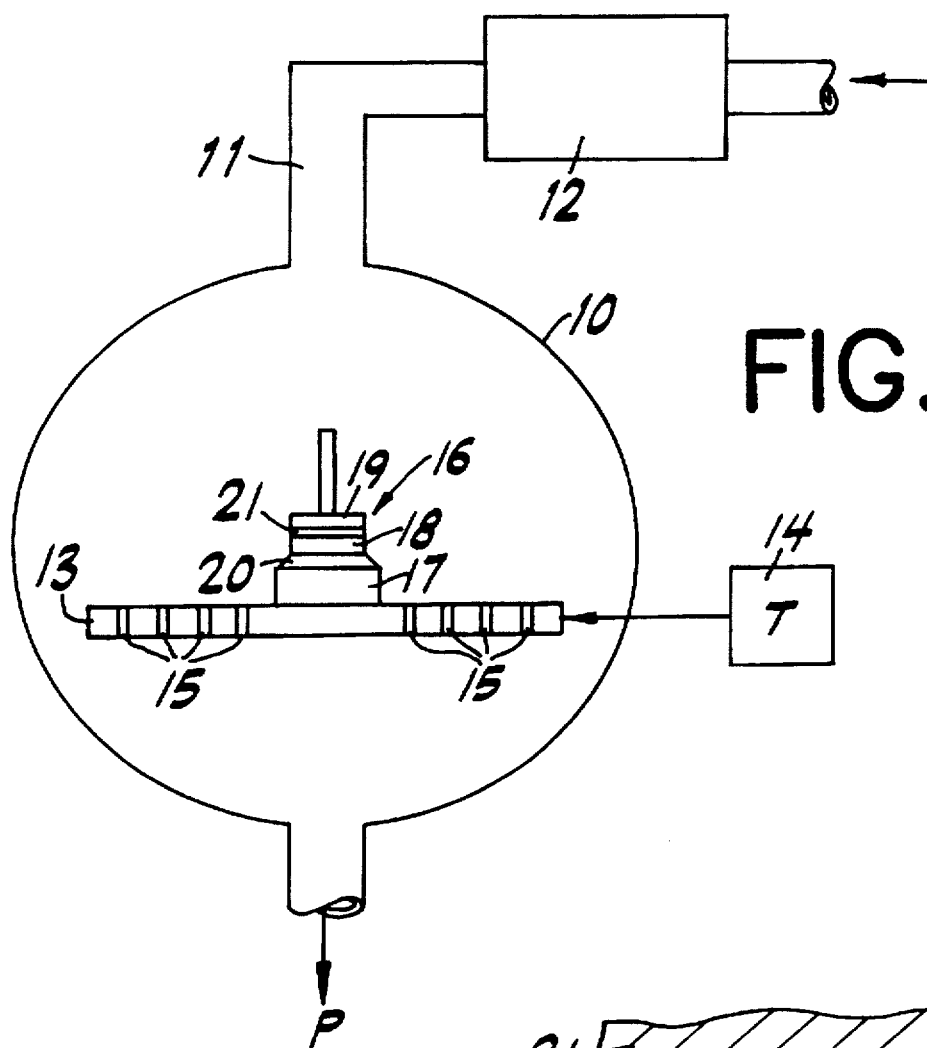
FIG. 1 is a diagrammatic depiction of a plasma reaction vessel according to the present invention.

The plasma etching apparatus depicted in FIG. 1 includes a plasma reaction vessel 10 which is fed, via a line 11, with plasma generated in a plasma generator 12. The plasma generator 12 is initially fed with a gaseous fluorine compound as the starting material for the plasma. This is, for example, a nitrogen fluoride, sulfur fluoride or carbon fluoride such as nitrogen trifluoride ($NF_3$), sulfur hexafluoride ($SF_6$) or carbon tetrafluoride ($CF_4$). Such an etching gas is further admixed with an oxygen-containing gas such as $O_2$ or $N_2O$ or the like, in order to effect, in certain cases, a maximization of the etching rate while at the same time minimizing an etching gas-specific layer deposition. In other cases, this additional gas can also be omitted.

The plasma generator 12 generates high-frequency electromagnetic waves, such as microwaves, which, by injection, ionize the etching gas being passed through. The free radicals and the ions produced may enter into chemical and physical interactions with solids. These processes take place at a pressure of, typically, 1 mbar, a pressure between 0.1 and 10 mbar being possible in individual cases. The throughput of the ionized etching gas through the reaction vessel 10 is effected by means of a pump P (not shown).

Because of the etching contour uniformity aimed for, care should be taken in the construction of the plasma generator 12 to preclude troublesome anisotropic physical interactions, e.g., impact processes.

Disposed in the reaction vessel 10 there is a hotplate 13 which is brought to a desired temperature by means of a temperature controller 14. The temperature is below the melting point of that component of a mounted semiconductor element to be treated, which has the lowest melting point. In general, this component will be the solder used. The hotplate 13 has ducts 15 which run parallel to the flow of the etching gas in order to improve flow. For the sake of simplification, only a single hotplate 13 is shown, but it is of course possible for a larger number of hotplates to be provided in the reaction vessel 10.

Onto the hotplate 13, the mounted or ready-soldered semiconductor elements are now placed. In the case of the illustrative embodiment according to the present invention shown, this involves a power diode 16 which, for the sake of illustration, is shown enlarged. In the practical application, a multiplicity of such semiconductor elements or power diodes is arranged on the hotplate 13 or the hotplates, and those are jointly subjected to the plasma etching process according to the present invention.

The power diode 16 shown includes a cold base 17, a diode chip 18 and a top wire connection 19. These three elements are joined together via solder layers 20, 21. In this arrangement, the power diode 16 rests on the hotplate 13 by its cold base 17, in order to ensure rapid and reliable heating.

Figure 2:
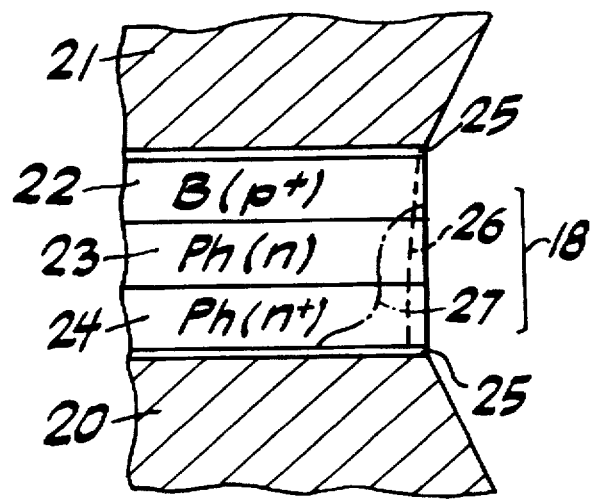
FIG. 2 shows a detail drawing of an edge zone of the semiconductor chip before and after etching according to the present invention.

As shown in FIG. 2 in enlarged detail, the diode chip 18 includes three layers, for example, a boron-($p^+$-) doped layer 22, a phosphorus- (n-) doped layer 23 and a phosphorus-($n^+$-) doped layer 24. To enable the diode chip 18 to be soldered on, the latter is provided, at its shallow sides, with a nickel layer 25. After the power diode 16 has been soldered together, cleaning of the until then still laterally exposed p-n junctions by means of removal of silicon is required, in order to develop the blocking ability of the p-n junctions. The cleaning or silicon removal is effected by means of the plasma etching process according to the present invention. On the grounds of isotropy and homogeneity, the only matter of interest in the application of this plasma etching process is the chemical interaction of the free radicals and ions contained in the plasma with the diode chip 18. Known commercial plasma etching installations which operate according to the downstream principle, are able to preclude any troublesome physical interactions, the prerequisite being the use of microwave excitation by the plasma generator 12. This results in the formation of long-lived etching free radicals having lifetimes of up to 1 second in terms of order of magnitude.

An important factor during etching is the temperature, since the etching operation is a thermally activated process. Heating of the diode chip 18 is effected—as has already been described—via the hotplate 13 and the cold base 17, arranged thereon, of the power diode 16. The gas flow rates of the etching gas should be chosen in accordance with the loading level of power diodes 16 or other semiconductor elements.

The plasma etching process according to the present invention allows an etching contour to be achieved as depicted by a dashed line 26. The chip edge after plasma etching runs almost vertically, whereas the wet etching profile emerging in the case of the known wet etching shows characteristic traces of orientation dependence and doping dependence. The wet etching profile is represented by a dot-and-dash line 27.

In the case of very highly blocking diodes, etching gas-specific contaminants of the plasma etching process described may result in the blocking-state voltage-current characteristics of the diodes being of insufficient quality and e.g., showing instabilities. To prevent this, a wet-chemical aftertreatment can be carried out in dilute alkali (e.g., KOH) or deionized water. In comparison with the conventional wet-etching process, this process is applied only for so short a time, that the etching profile-determining process of plasma etching remains, i.e., that the etching profile 26 is retained.

Alternatively, a plasma-chemical aftertreatment in an $O_2$-, $N_2$- or $H_2$-containing plasma can be carried out. Although the etching process according to the invention has been described for a specific type of semiconductor diodes comprising a characteristic semiconductor chip and special connection elements, the invention is of course not limited to this specific embodiment.

What is claimed is:

1. An etching method for a semiconductor element, the semiconductor element including a semiconductor chip and a laterally exposed p-n junction the semiconductor chip being joined to each of a cold base element and to a connection element via a respective solder layer, comprising the steps of:

receiving plasma via an inlet of a plasma reaction vessel;

removing the plasma via an outlet of the plasma reaction vessel, the outlet being positioned opposite to the inlet, the inlet and the outlet defining a flow direction of the plasma;

providing a plate-like heating device arranged substantially transverse to the flow direction of the plasma, the heating device arranging the semiconductor element on the cold base element and having at least one through-hole arranged substantially in the flow direction of the plasma so that the plasma flows laterally past the exposed p-n function; and heating the semiconductor element, using the heating device coupled to a temperature controller, to regulate a temperature of the semiconductor element to be in a range between room temperature and a melting point of the respective solder layer.

2. The etching method according to claim 1, wherein the temperature is in the region of the melting point of the solder.

3. The etching method according to claim 1, further comprising the step of admixing the at least one etching gas with an oxygen-containing gas.

4. The etching method according to claim 3, wherein the oxygen-containing gas includes one of $O_2$ and $N_2O$.

5. The etching method according to claim 1, further comprising the step of applying an aftertreatment, the aftertreatment including one of a thermal aftertreatment, a wet-chemical aftertreatment and a plasma-chemical aftertreatment.

6. The etching method according to claim 5, wherein the wet-chemical aftertreatment is accomplished via one of a dilute alkali and a deionized water.

7. The etching method according to claim 5, wherein the plasma-chemical aftertreatment is accomplished via one of an $O_2$-, an $H_2$-, and a $N_2$- containing plasma.

8. The etching method according to claim 1, wherein the step of applying the at least one etching gas further includes the steps of:

ionizing the at least one etching gas via an injection of high-frequency electromagnetic waves; and supplying the ionized at least one etching gas in a plasma reaction vessel.

9. The etching method according to claim 8, wherein the electromagnetic waves include microwaves.

10. The etching method according to claim 8, wherein the at least one etching gas flows through the plasma reaction vessel.

11. An apparatus for etching a semiconductor element that includes a semiconductor chip and a laterally exposed p-n junction, the semiconductor chip being joined to each of a cold base and to a connection element via a respective solder layer, comprising:

a plasma reaction vessel having an inlet for accepting plasma and an outlet positioned opposite to the inlet for removing the plasma, the inlet and the outlet defining a flow direction of the plasma;

a plate-like heating device disposed in the plasma reaction vessel for heating the semiconductor element and arranged substantially in a traverse direction to the flow direction of the plasma, the heating device arranging the semiconductor element on the cold base and having at least one through-hole extending in the flow direction of the plasma so that the plasma flows laterally past the exposed D-n junction; and a temperature controller coupled to the heating device for regulating a temperature of the semiconductor element to be between room temperature and a melting point of the respective solder layer.

12. The apparatus according to claim 11, wherein the plasma generating system includes a feed line for the gaseous fluorine compound and the plasma generating system is disposed upstream of the plasma reaction vessel.

13. The apparatus according to claim 11, wherein the plasma generating system includes a microwave generator.

14. An etching method for cleaning a laterally exposed p-n junction of a semiconductor element after the semiconductor element has been soldered to a connection element, comprising the steps of:

providing a heating device including at least one through-hole;

heating the semiconductor element, using the heating device, to a temperature in a range between room temperature and a melting point of a solder used to solder the semiconductor element to the connection element; and applying at least one etching gas to the semiconductor element, the at least one etching gas including a fluorine compound.

15. The etching method according to claim 14, wherein the at least one through-hole of the heating device extends parallel to a flow direction of the at least one etching gas for allowing the at least one etching gas to circulate through the at least one through-hole.

16. An apparatus for applying an etching technique for cleaning a laterally exposed p-n junction of a semiconductor element after the semiconductor element has been soldered to a connection element, comprising:

a plasma reaction vessel having first through-holes disposed therethrough;

a pump system coupled to the plasma reaction vessel;

a plasma generating system coupled to the plasma reaction vessel for generating at least one etching gas from a gaseous fluorine compound; and a heating device disposed in the plasma reaction vessel for heating the semiconductor element, the heating device having at least one second through-hole.

17. The apparatus according to claim 16, wherein the at least one second through-hole of the heating device extends parallel to a flow direction of the at least one etching gas for allowing the at least one etching gas to circulate through the at least one second through-hole.

18. The method according to claim 1, wherein the semiconductor element includes a power diode.

19. The apparatus according to claim 11, wherein the semiconductor element includes a power diode.

* * * * *

UNITED STATES PATENT AND TRADEMARK OFFICE
CERTIFICATE OF CORRECTION

PATENT NO. : 5,763,326
DATED : June 9, 1998
INVENTOR(S) : Stephan-Manuel Barth

It is certified that error appears in the above-identified patent and that said Letters Patent is hereby corrected as shown below:

Column 5, line 41, "Joined" should be
--joined--.

Column 5, line 56, "D-n" should be
--p-n--.

Signed and Sealed this

Eighth Day of June, 1999

*Attest:*

Q. TODD DICKINSON

*Attesting Officer*  Acting Commissioner of Patents and Trademarks